United States Patent
Rubehn et al.

(10) Patent No.: US 8,594,225 B2
(45) Date of Patent: Nov. 26, 2013

(54) CIRCUIT ARRANGEMENT, APPARATUS AND PROCESS FOR THE SERIAL SENDING OF DATA VIA A CONNECTION CONTACT

(75) Inventors: Thilo Rubehn, Gundelfingen (DE); Joachim Ritter, Loerrach (DE); Gert Umbach, Gundelfingen (DE); Dieter Baecher, Sexau (DE); Wolfgang Horn, Klagenfurt (AT); Joerg Franke, Freiburg (DE)

(73) Assignee: Micronas GmbH, Freiburg (DE)

( * ) Notice: Subject to any disclaimer, the term of this patent is extended or adjusted under 35 U.S.C. 154(b) by 975 days.

(21) Appl. No.: 12/370,702

(22) Filed: Feb. 13, 2009

(65) Prior Publication Data

US 2009/0252210 A1 Oct. 8, 2009

(30) Foreign Application Priority Data

Mar. 28, 2008 (EP) .................... 08005967

(51) Int. Cl.
*H04L 27/00* (2006.01)
(52) U.S. Cl.
USPC .......................... 375/295; 714/724
(58) Field of Classification Search
USPC .......................... 375/295; 714/724
See application file for complete search history.

(56) References Cited

U.S. PATENT DOCUMENTS

| | | | |
|---|---|---|---|
| 6,968,484 B2* | 11/2005 | Hummel | 714/721 |
| 2004/0210805 A1 | 10/2004 | Kimelman et al. | |
| 2007/0216438 A1 | 9/2007 | Gupta et al. | |
| 2007/0294605 A1* | 12/2007 | Bidenbach et al. | 714/724 |

FOREIGN PATENT DOCUMENTS

| | | |
|---|---|---|
| DE | 19819265 C1 | 8/1999 |
| DE | 102006022985 | 11/2007 |
| JP | 2003-069653 A | 3/2003 |

OTHER PUBLICATIONS

EP Serial No. EP 08 005 967.8 filed Mar. 28, 2008, German EP Search Report (5 pages).
Japanese Office Action for Japanese Application No. 2009-046537 dated Jul. 18, 2013 with English translation.

* cited by examiner

*Primary Examiner* — Shuwang Liu
*Assistant Examiner* — Nader Bolourchi
(74) *Attorney, Agent, or Firm* — Muncy, Geissler, Olds & Lowe, PLLC

(57) ABSTRACT

The invention relates to an integrated circuit arrangement with connection contacts for the serial exchange of data and/or signals with external components and apparatuses and with a control apparatus and/or a serial interface for the clocked receiving of data by means of a signal voltage on such a connection contact, which voltage is modulated between at least one low, one middle and one high voltage state. The control apparatus and/or the interface are designed in such a manner that data is sent in a sending mode via the connection contact in that the switching apparatus, after having received a slope changing in particular from the middle voltage state into in particular the higher or the lower voltage state, pulls the voltage state into the in particular opposite lower or higher voltage state. Furthermore, the invention relates to an apparatus and a process for operating such a circuit arrangement.

18 Claims, 3 Drawing Sheets

CIRCUIT ARRANGEMENT, APPARATUS AND PROCESS FOR THE SERIAL SENDING OF DATA VIA A CONNECTION CONTACT

RELATED APPLICATIONS

This application claims priority to European Patent Application 08 005967.8, filed Mar. 28, 2008, the entire contents of which are herein fully incorporated by reference.

BACKGROUND OF THE INVENTION

1. Field of the Invention

The present invention relates to the serial transmission of data by modulation of a signal voltage on a connection contact of an integrated circuit. More specifically, the present invention relates to the sending of data via a connection contact to a circuit arrangement having a controller for the receiving of data by means of a modulated signal voltage.

2. Description of the Related Art

DE 198 19 265 C1 describes a process for the parametrizing of an integrated circuit arrangement as well as an integrated circuit arrangement for this purpose. A start is made here from an integrated circuit arrangement comprising substantially permanently wired and permanently connected components. Parameters for the operation of the circuit arrangement can be given by a parametrization. A signal voltage connection on which a signal voltage is applied serves for the inputting of the parameters. The actual parameters are modulated onto the signal voltage, during which a comparator connected in after the signal voltage connection checks the applied signal voltage to see whether it rises above a threshold value.

Moreover, housings with a great plurality of connection contacts in the form of so-called pins are generally known, which housings serve to receive integrated circuit components, among other things. The inclusion of a freely programmable digital processor with further components required for the operation of a processor in the housing is known. Customarily, two connection contacts of the housing serve to apply a supply voltage and a base voltage, two further connection contacts to apply an earth connection or zero voltage and an operating voltage and a plurality of further connection contacts serve to input or output data.

Such circuit arrangements and also other integrated circuit arrangements use for testing and checking purposes either signal connection contacts run out of the corresponding housing for parallel or serial testing, or use, to the extent that only a few connection contacts are present, a single-level modulation of the supply voltage according to DE 198 19 265 C1 and/or a single modulation of the current consumption.

In order to be able to carry out a rapid unidirectional serial and synchronous test of an integrated circuit arrangement, DE 10 2006 022 985 A1 describes a circuit arrangement with a serial test interface for controlling a test operating mode, with a freely programmable digital processor, with a housing for receiving the test interface and the processor, and with connection contacts for a data and/or signal exchange with external components and apparatuses, in which a modulated single voltage can be applied on one of the connection contacts for transferring data and/or a cycle using at least two controllable voltage levels. The exceeding and/or dropping below the two voltage levels can already be detected by at least two comparators.

In integrated circuit arrangements for very few contact pins or PINs, each extra PIN is relatively expensive. It is therefore important to make possible a fully synchronous bidirectional communication in circuit arrangements for test purposes of the circuit arrangements themselves via as small a number of contact pins as possible.

Compared to the earlier state of the art, DE 10 2006 022 985 A1 eliminates disadvantages in that the transmission of a cycle and additionally of data takes place from a higher-order apparatus to the structural component via a voltage supply. An independent cycle source in the integrated circuit arrangement can be eliminated for a test operating mode as long as it is tested. A cycle that is transmitted frequently into the integrated circuit arrangement is also already made possible here. However, this concerns only a unidirectional transmission of data and thus an intersection that is only unidirectionally voltage-modulating. For a transmission of data or, optionally also sensor data, in the actual operation from the integrated circuit arrangement to a higher-order apparatus either a current modulation, that is expensive to design, at the supply voltage connection or the use of an additional contact pin or PINs is necessary.

The invention has the problem of suggesting for the serial sending of data via a connection contact an improved circuit arrangement, an apparatus designed for communication with it and a process that is improved for this purpose which can also be used in integrated circuit arrangements with a reduced number of in particular only two connection contacts without loss of possible functionalities or capacities. In particular, a test operating mode should be improved in a circuit arrangement according to DE 10 2006 022 985 A1 in such a manner that two voltage contact pins in addition to a voltage supply also make possible a bidirectional data transfer with low construction cost at the same time.

SUMMARY OF THE INVENTION

An aspect of the present invention is to provide a circuit arrangement, apparatus and process that responds to the concerns noted above.

Another aspect of the present invention is to provide for the serial sending of data via a connection contact by the circuit arrangement with the features noted herein by an apparatus and with a process as noted herein. Alternative aspects and adaptive embodiments of the present invention are related thereto.

Accordingly, an integrated circuit arrangement with connection contacts for the serial exchange of data and/or signals with external components and apparatuses and with a control apparatus and/or a serial interface for the cycle-clocked receiving of data by means of a signal voltage on such a connection contact, which voltage is modulated between at least one low, one middle and one high voltage state, is preferred. This is advantageously achieved in that the control apparatus and/or the interface comprise/s a switching apparatus, which latter are designed and/or controlled in such a manner that data is sent in a sending mode via this connection contact in that the switching apparatus, after having received a slope changing from one of the voltage states into another one of the voltage states, pulls this other one of the voltage states before the chronological expiration of half a clock cycle of the cycle into one of the voltage states that is different from the viewpoint of this other one of the voltage states.

In particular, data is sent in the sending mode via this connection contact in that the switching apparatus, after having received a slope changing from the middle voltage state into the higher or the lower voltage state, pulls the voltage state before the chronological expiration of half a clock cycle of the cycle into the opposite (from the viewpoint of the middle voltage state) lower or higher voltage state.

A current modulation on the voltage connection for the retransmission of data from the integrated circuit arrangement to a higher-order apparatus can be eliminated in a surprisingly simple manner by such a design. Even the making available of an additional contact pin or PINs for transmitting data from the circuit arrangement into the higher-order apparatus is no longer necessary. A fully synchronous bidirectional communication via only a single contact pin is made possible in a simple manner. That is, data should be transmitted simultaneously via preferably a single signal line in both directions and in particular in addition a cycle for the synchronous processing of the data. As a result, an operating cycle is also advantageously necessary only on one of the two sides, which cycle is made available for the single-wire interface preferably externally to the integrated circuit arrangement. No intrinsic cycle has to be present on the cycle receiver side, that is, in the single-wire intersection internal to the circuit arrangement. Additionally, a mass or base voltage connection or common mass connection is optionally present in a customary manner.

Such a circuit arrangement is preferably provided with a comparator circuit that is designed and/or controlled to extract data modulated onto the signal voltage as well as data internal to the circuit arrangement as well as also a cycle modulated onto the signal voltage as well as a cycle internal to the circuit arrangement.

The circuit arrangement is preferably provided with a sending control on the circuit-arrangement side that comprises a counter, e.g., a shift register for counting a number of cycles with data sent from the apparatus or voltage states and comprises components for sending the data to the apparatus when a counting value of the counter that is fixed or can be set as fixed has been reached.

The circuit arrangement is advantageously provided with a transistor arrangement for the weak pulling of the signal voltage into the other, in particular opposite voltage state and with a transistor arrangement for the strong pulling of the signal voltage into the other, in particular opposite voltage state. As a result, the applied signal voltage can be pulled with a different force in the desired direction. The weak pulling makes it possible in particular to control a recessive voltage change that can be readily overloaded by the communicating apparatus in contrast to a strong pulling.

Such a circuit arrangement can be advantageously designed and/or controlled for a test operating mode for applying the cycle applied with the signal voltage as internal cycle on components of the circuit arrangement. Thus, the cycle is made available for the internal circuit as an operating cycle. This cycle is produced by the modulation of the signal voltage. That is, the internal circuit can directly react after every slope generated by the higher-order apparatus as an external clockmaster. The internal circuit can in particular distort a middle voltage level externally striven for to a lower or also to a higher level. The distortion of a high into a low level is described in the following by way of example. As a result, the integrated circuit does not obligatorily have to have its own clock source or carry out in a test operating mode a synchronization of its own clock source and of an external clock source of the apparatus to be tested.

Such a circuit arrangement is preferably provided with a switching apparatus for activating a comparator circuit for analyzing the signal voltage and/or a test interface in a test operating mode and/or in a development of the circuit arrangement and/or in a development of the software of the circuit arrangement and/or in a band end programming and/or in an error search in an application realized by the circuit arrangement. As a result, for example, a switching can be readily carried out between a test operating mode and a regular operating mode.

Such a circuit arrangement can be preferably provided with e.g., a sensor arrangement and designed and/or controlled for outputting data, especially measuring or sensor data, made available by the circuit arrangement and/or an arrangement following it as the data to be sent in the sending mode via the connection contact. In this manner a sensor with only three connection contacts and controllable by a higher-order apparatus can be supplied via them with the signal voltage, receive data for its control and send test results and/or measured value as data.

An apparatus with connection contacts for serial data and/or signal exchange with an integrated circuit arrangement, such a preferred circuit arrangement, is independently advantageous if the apparatus placed above the circuit arrangement is provided with a control apparatus and/or a serial interface for sending data clocked by a cycle by the modulation of a signal voltage between at least one low, one middle and one high voltage state on such a connection contact if the interface is designed and/or controlled in such a manner that it changes in the receiving mode from one of the voltage states into another one of the voltage states and it detects a reception of data from the circuit arrangement at least upon a pulling of this other voltage state prior to the chronological expiration of one half a clock cycle of the cycle into one of the voltage states that is different from the point of view of this other voltage state by the circuit arrangement.

In particular, the interface is designed and/or controlled in such a manner that it changes in a receiving mode from the middle voltage state as the one voltage state into the higher or the lower voltage state as the other voltage state and detects a reception of data from the circuit arrangement at least upon a pulling of the voltage state prior to the chronological expiration of one half a clock cycle of the cycle into the lower or higher voltage state that is the opposite one, from the point of view of the middle voltage state, by the circuit arrangement.

The interface is preferably designed and/or controlled for the recessive application of the signal voltage during the change into the other one of the voltage states, especially into the higher or the lower voltage state as the other voltage state during the receiving mode. A recessive voltage state makes it possible for the connected integrated circuit in a simple manner to pull the signal voltage into another voltage state in order to carry out a signaling of data in this manner.

Such a preferred integrated circuit arrangement and such a preferred apparatus can be used accordingly with preference in a system for the transmission of data or signals via a common connection contact.

A process for the serial transmission of data by modulation of a signal voltage between at least one low, one middle and one high voltage state on a connection contact of an integrated circuit arrangement is independently advantageous if the slope changing signal voltage with one of the voltage states into another one of the voltage states is applied by an apparatus connected to the connection contact onto this connection contact in a receiving mode, and the signal voltage is pulled into one of the voltage states that is different from the point of view of this other one of the voltage states by the circuit arrangement for sending after reception of the slope.

Such a process is preferred in which the slope is applied on the connection contact by the apparatus and on the one hand the signal voltage is pulled into the opposite one, from the point of view of the middle voltage state as one of the voltage states, of the lower or higher voltage state as one of the other voltage states by the circuit arrangement for sending a first data state after reception of the slope, and on the other hand for sending a second data state after reception of the slope the signal voltage is left in the voltage state applied by the apparatus. A protocol that takes account such a course makes possible a direct sending of data by the apparatus to the circuit arrangement at appropriately given times or cycles by the application of high voltage states or low voltage states that are interpreted as such by the circuit arrangement. On the other hand, an indirect sending of data takes place in the inverse direction by successively following data or voltage states in which the circuit arrangement after the reception of the slope selectively leaves the voltage state as it was or pulls it into the other voltage state.

The signal voltage is preferably changed by a cycle in a clocked manner, during which the signal voltage is pulled after the reception of the slope prior to the chronological expiration of one half a clock cycle of the cycle by the integrated circuit arrangement into the opposite, from the point of view of the middle voltage state as one of the voltage states, lower or higher voltage state as the other one of the voltage states.

A protocol is preferably used here according to which a fixed number of successively following times or cycles, clock cycles may be sent by the apparatus and thereafter or, alternating therewith, a fixed number of successively following times or clock cycles, at least one clock cycle, may be sent by the circuit arrangement.

The signal voltage is preferably changed in a clocked manner within a clock cycle by the apparatus for transmitting a cycle to the circuit arrangement by means of a change of the voltage state of the signal voltage between two of the middle voltage states, of the higher voltage state or of the lower voltage state, and by changing the voltage state back.

The present invention relates to an integrated circuit arrangement with connection contacts for the serial exchange of data and/or signals with external components and apparatuses and with a control apparatus and/or a serial interface for the cycle-clocked receiving of data by means of a signal voltage on such a connection contact, which voltage is modulated between at least one low, one middle and one high voltage state. The control apparatus and/or the interface comprises a switching apparatus designed or controlled in such a manner that data is sent in a sending mode via the connection contact in that the switching apparatus, after having received a slope changing from one of the voltage states into another of the voltage states, pulls this other one of the voltage states before the chronological expiration of half a clock cycle of the cycle into one of the voltage states that is different from the viewpoint of the other one of the voltage states. For example, a slope changing from the middle voltage state into in particular the higher or the lower voltage state, pulls the voltage state into the in particular opposite lower or higher voltage state. Furthermore, the invention relates to an apparatus and a process for operating such a circuit arrangement.

According to an embodiment of the present invention there is provided a system for the transmission of data or signals via a common connection contact with an integrated circuit arrangement of an apparatus. The system comprises the integrated circuit, wherein the circuit arrangement further comprises a number of connection contacts for the serial exchange of data and/or signals with external components and apparatuses, and the control apparatus for the cycle-clocked receiving of data and/or signals by means of a signal voltage on the connection contact. The voltage being modulated between at least a low, a middle, and a high voltage state.

The apparatus further comprises a set of connection contacts for serial data and/or signal exchange with an integrated circuit arrangement. There is also included a control apparatus for sending data clocked by a cycle by the modulation of a signal voltage between the low, middle, and high voltage states on such a connection contact.

The integrated circuit and the apparatus are characterized further in that the interface is designed and/or controlled in such a manner that it changes in the receiving mode from one of the voltage states into another one of the voltage states; and, it detects a reception of data from the circuit arrangement at least upon a pulling of this other voltage state prior to the chronological expiration of one half a clock cycle of the cycle.

The above, and other aspects, features and advantages of the present invention will become apparent from the following description read in conjunction with the accompanying drawings, in which like reference numerals designate the same elements.

DETAILED DESCRIPTION

Figure 1:
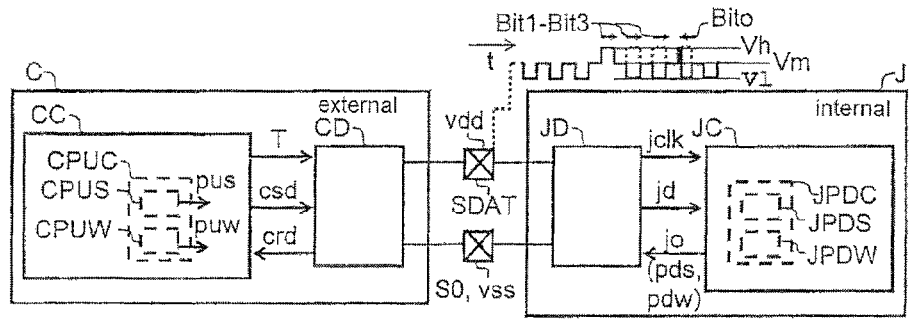
FIG. 1 shows components of an integrated circuit arrangement which are connected via two voltage contact pins to a higher-order apparatus, for example, a testing circuit.

Reference will now be made in detail to several embodiments of the invention that are illustrated in the accompanying drawings. Wherever possible, same or similar reference numerals are used in the drawings and the description to refer to the same or like parts or steps. The drawings are in simplified form and are not to precise scale. For purposes of convenience and clarity only, directional terms, such as top, bottom, up, down, over, above, and below may be used with respect to the drawings. These and similar directional terms should not be construed to limit the scope of the invention in any manner. The words "connect," "couple," and similar terms with their inflectional morphemes do not necessarily denote direct and immediate connections, but also include connections through mediate elements or devices.

FIG. 1 schematically shows an integrated circuit arrangement J and components of such an integrated circuit arrangement J that is connected to a higher-order apparatus C as an external apparatus from the point of view of the circuit arrangement.

Ideally, the connection takes place here in particular for a test operating mode via only two connection contacts S0, SDAT that function as contact pins for transmitting a base voltage vss and a signal voltage v. Accordingly, integrated circuit arrangement J as well as higher-order apparatus C each comprise a serial interface circuit JD, CD. A mass connection but also a voltage applied on any fixed voltage level can be understood under base voltage vss. The signal voltage v denotes a voltage that is at a higher or lower voltage level relative to the base voltage.

In higher-order apparatus C, a control apparatus CC assumes, in addition to optional further functions, the making available of a cycle T and of data csd that are transmitted via serial interface circuit CD of higher-order apparatus C to circuit arrangement J. Moreover, data crd received from serial interface circuit CD are passed on to the control apparatus of higher-order apparatus C. Such received data crd is also received via the preferably only two connection contacts and in particular the second of connection contacts SDAT by integrated circuit arrangement J.

Integrated circuit arrangement J also comprises a interface circuit JD internally for the serial transmission of data jo from this circuit arrangement J via the second connection contact SDAT to higher-order apparatus C respectively for receiving a cycle T and of data csd from higher-order apparatus C. Accordingly, the interface of circuit arrangement J makes data jd and an internal cycle jclk available for its control apparatus JC, that serves at the same time as a sending control. This cycle was previously obtained from a cycle T received via the in particular second connection contact SDAT from higher-order apparatus C. Sending control JC of the integrated state of the art thus processes this received data further, preferably with the aid of received cycle T as an internal cycle jclk generated from it and of integrated circuit arrangement J. Furthermore, control apparatus JC makes available as sending control in addition to data to be transmitted even appropriate control signals for interface circuit JD, so that interface circuit JD of the control arrangement can transmit data jo to be transmitted via the second connection contact SDAT to the higher-order apparatus C.

Figure 2:
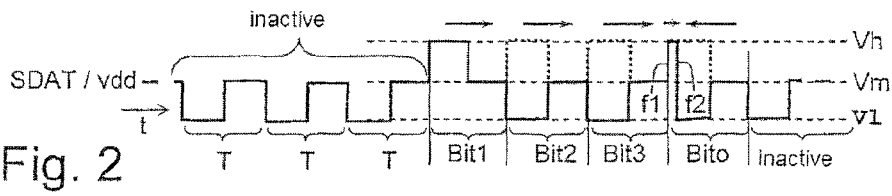
FIG. 2 shows a voltage course that can be measured by way of example on a signal voltage connection between the higher-order apparatus and the integrated circuit arrangement.

FIG. 1 sketches an exemplary voltage course over time t on the second connection contact SDAT, and the voltage course is also sketched in FIG. 2 on an enlarged scale. It can be recognized that signal voltage v controls essentially three different voltage levels or voltage states Vl, Vm and Vh.

Figure 3:
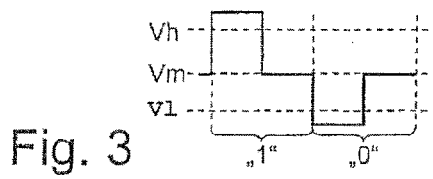
FIG. 3 shows voltage states for transmitting a logical one and a logical zero.

In a first chronological section an inactive area is sketched, in which essentially a square-wave voltage alternates between the two lower voltage states Vl and Vm. Four bits—bit1, bit2, bit3, bito—are subsequently sketched that serve for the communication. Each of these bits lasts, as can also be recognized from FIG. 3, for an entire clock cycle T of cycle T of higher-order apparatus C.

According to a preferred protocol, the first three bits bit1-bit3 serve to transmit from higher-order apparatus C to integrated circuit arrangement J connected to it. In order to make a first active operating state recognizable the first bit bit1 changes with the rising slope into the highest, third voltage state Vh. The two following cycles or bits bit2, bit3 serve to transmit data csd from higher-order apparatus C to circuit arrangement J connected to it. An alternating change between the middle voltage state Vm and either the low or the high voltage state Vl or V is made as a function of the data state to be transmitted. The fourth cycle T respectively the fourth bit bito serve to transmit data in the opposite direction, that is, from the integrated circuit arrangement J to the higher-order apparatus C. Thereafter, a phase of inaction or inactivity follows again.

The first bit, bit1, thus serves after a time of inactivity as a start signal or as a start bit of a corresponding data frame of, for example, four bits including the start bit. Following the start bit the two bits bit2, bit3 are provided and present per data frame for the transmission from the higher-order apparatus to the connected circuit arrangement and a terminating bit bito for the transmission of data in the opposite direction.

In a corresponding manner, the integrated circuit arrangement J correspondingly comprises a pull-down driver JPDC that applies a weak or a strong pull-down signal pdw, pds on interface circuit JD with in particular a weak pull-down driver and a strong pull-down driver JPDS. Interface circuit JD pulls signal voltage v to the low voltage state Vl after the first slope f1 at the end of the third cycle or at the beginning of the fourth cycle bito for sending a zero state as a function of the applied signal.

In order to make possible a transmission from circuit arrangement J to higher-order apparatus C, interface circuit CD of higher-order apparatus C applies a rising slope f1 at the end of the third cycle or at the beginning of the fourth cycle, so that signal voltage v changes from the middle voltage state Vm to the high voltage state Vh.

There are now two possibilities for a transmission for circuit arrangement J, i.e., to transmit a high or a low state. If circuit arrangement J wishes to transmit a high state, respectively a binary one, circuit arrangement J leaves signal voltage v in the high voltage state Vh. After one half of a clock cycle interface circuit CD of the higher-order apparatus then pulls signal voltage v again for a further one half clock cycle to the middle voltage state Vm. On the other hand, if the circuit arrangement wishes to transmit a low state, respectively a binary zero, it pulls the signal voltage into the low voltage state Vl after the first rising slope f1 changing into the high voltage state Vh, as a consequence of which a falling second slope f2 follows the rising slope f1 as close as possible in time.

As an alternative to the pulling down into the low voltage state Vl there is also the possibility that the integrated circuit arrangement pulls down the second slope f2 only to the middle voltage state Vm. However, a corresponding construction is more expensive to design considering a cycle regeneration in integrated circuit arrangement J. In general, it can be realized that in the modulation a change can be made not only from the middle voltage state Vm into the high or the low voltage state Vh, Vl, but rather that the association of the three voltage states Vl, Vm and Vh can be fixed as desired. For example, a change can also be made between the high and the low voltage state Vh, Vl in order to transmit cycle T and in order to transmit data csd, jo a change into the middle voltage state Vm can be used.

In order to make such a bidirectional data transmission possible, higher-order apparatus C comprises a pull-up driver CPUC in its control apparatus CC or as independent component. This driver supplies interface circuit CD with appropriate pull-up signals pus, puw, based on which interface circuit CD regulates signal voltage v in a corresponding manner. In particular, in pull-up driver CC a weak pull-up driver CPUS makes possible a weak pull-up signal pus and a strong pull-up driver CPUW makes a strong pull-up signal puw available. Furthermore, a strong signal is preferably made available for pulling a strong middle voltage state for the particular second half of a cycle T.

In particular in the fourth cycle or at the fourth bit bito, interface circuit CD regulates signal voltage v onto a high but recessive voltage state Vh as a function of an applied weak pull-up signal csd so that the connected integrated circuit arrangement J can pull down the high voltage state Vh again. Alternatively, instead of a correspondingly designed low-level-dominant communication line the process could also be implemented appropriately using a high-level-dominant communication line.

In order to operate the presented integrated circuit arrangement J a signal voltage v is applied on it. To this end of the first one of the connection contacts S0 is connected, for example, to a base voltage vss and the signal voltage v is applied on the second one of connection contacts SDAT.

In the present of exemplary embodiment the applied signal voltage v is modulated over the course of time t in accordance with the sketched voltage-time diagram. For example, a first voltage level as a first voltage state Vl or a voltage level that is lower in comparison to it should be required as signal voltage v for integrated circuit arrangement J. The modulation of data csd to be transmitted from higher-order apparatus C to circuit arrangement J takes place in that a varying signal voltage v with a higher voltage level than the first voltage state Vl is applied for the transmission of data. In particular, preferably two or even more higher voltage levels are implemented as middle voltage state Vm or higher voltage state Vh in a protocol so that not only pure data but rather preferably also a cycle P can be transmitted by signal voltage v. Interface circuits CD, JD carry out in accordance with the preferred embodiment a conversion of a serial data transmission to a parallel data transmission respectively a conversion of parallel data to serial data in the inverse direction for outputting the data measured by sensor S or other data.

Figure 4:
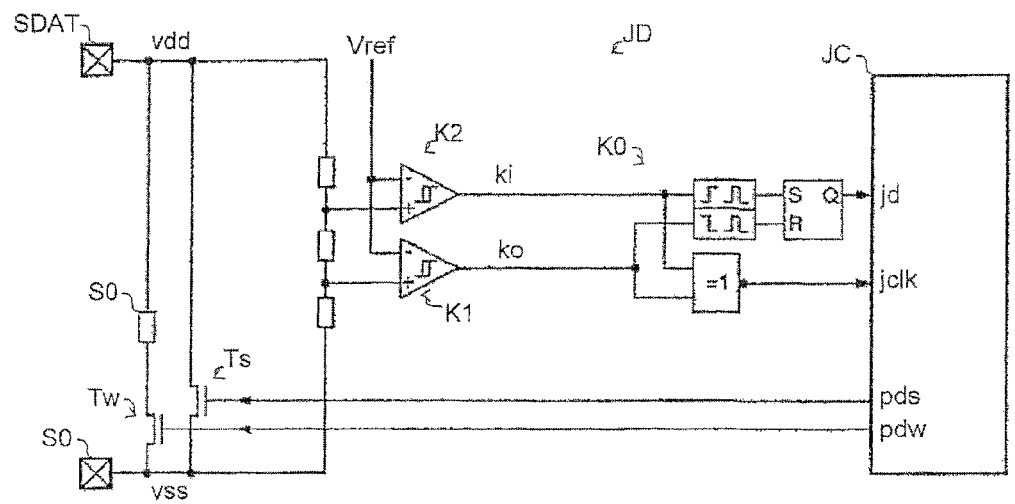
FIG. 4 shows an exemplary circuit arrangement for a comparator for extracting data and a cycle from an applied signal voltage.

In order to be able to analyze the voltage level, that is, to be able to determine the data csd transmitted by signal voltage v, the interface circuit JD of circuit arrangement J shown in FIG. 4 by way of example comprises a comparator circuit K.

The base voltage vss and the signal voltage v applied with varying level, which are tapped off from interface circuit JD and/or directly from the two connection contacts S0, SDAT, are applied in particular onto corresponding inputs of comparator circuit K.

A resistance chain is connected with three resistors R in series between base voltage vss and signal voltage v.

A first comparator K1 of comparator circuit K has two inputs and a node is connected to a positive input connected between the two first resistors R from the viewpoint of base voltage vss. A negative input of the first comparator K1 is applied on a reference voltage Vref. Reference voltage Vref can be, for example, an internal voltage value located at the middle voltage level between the first and the third voltage level, preferably approximately at the height of the middle voltage state Vm. Reference voltage Vref can, e.g., be a voltage generated internally with a band gap over temperature and voltage.

A second comparator K2 also has two inputs of which the negative input is connected to reference voltage Vref. The positive input is connected to a node connected from the viewpoint of the base voltage between the second and the third of resistors R.

The outputs of the first and of the second comparator K1, K2 are applied on an extraction circuit K0 for pulling out the original cycle T of transmitting apparatus C and for making available an internal cycle jclk corresponding to this cycle T. A direct synchronization of the received external data csd and jd preferably takes place on the internal cycle jclk generated in this manner by the transmission of external cycle T into integrated circuit arrangement J. Comparator output signals ko, ki of the two comparators K1 and K2 are applied on further circuit components.

A further resistor Rw is connected via a source-train track of a first transistor Tw between signal voltage v and base voltage vss. A second transistor Ts is connected with its source-train track directly between signal voltage b and base voltage vss. Among other things, the further resistor Rw and the two transistors Tw, Ts form components of a switching apparatus that is designed and/or controlled in such a manner that data jo of switching apparatus J can be sent in a sending mode via the connection contact.

In essence, the process for determining the received cycle T, from which the internal cycle jclk is generated, and the external data csd, from which the internal data jd is generated in circuit arrangement J takes place similarly to the apparatus and process in accordance with DE 10 2006 022 985 A1.

This data jd generated internally by interface circuit JD and the internal cycle jclk as well as the data jo to be transmitted to higher-order apparatus C are applied on control apparatus JC, that makes the two pull-down signals pdw, pds available on the basis in particular of this received data jd by means of pull-down driver JPDC as a function thereof.

These two pull-down signals pdw, pds serve to signalize the actual data jo to be transmitted and are applied on interface circuit JD. As can be gathered from FIG. 4, the weak pull-down signal pdw is applied on the first transistor Tw, that is connected in series with the further resistor Rw between base voltage vss and signal voltage v. An applied weak pull-down signal pdw thus brings about a weak pulling down of signal voltage v. The strong pull-down signal pds is, on the other hand, applied on the second transistor Ts, that is directly connected between base voltage vss and signal voltage v. Thus, the gate connections of the two transistors Tw and Ts are controlled by the pull-down signals pdw, pds.

The integrated circuit arrangement can additionally comprise as a special feature and in addition to comparator circuit K a test interface TFI respectively test interface circuit for a test operation. The comparator circuit K as well as such a test interface can be advantageously integrated in interface circuit JD or be directly connected to it via their own lines or their own bus.

The base voltage vss can be optionally connected via a switch and for closing the switch a release signal can be applied for activating an active operating mode, in particular a test operating mode. The comparators K1, K2 can be cut out by the deactivation when the integrated circuit J is not in the operating mode, so that less current is consumed.

The active operating mode is preferably activated in that a certain bit sequence is present in a given register area, especially in two EEPROM cells, or a corresponding bit sequence is received via the current from transmitted data csd. This preferably concerns, as sketched in FIGS. 1 and 2, a first bit bit1 set in the high voltage state Vh. This first bit bit1 follows a sequence of zeros that are signalized by an alternation of the signal voltage v between the low and the middle voltage state Vl, Vm. The sequence of 0's signalizes an inactive or idle state of higher-order apparatus C.

Figure 5:
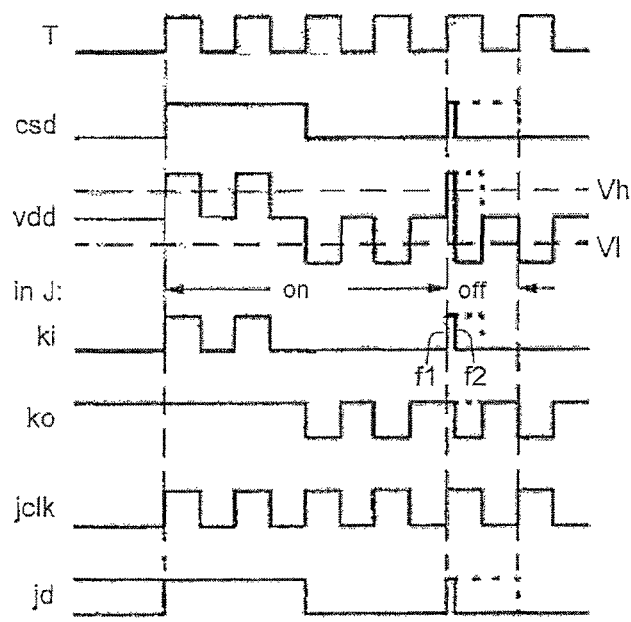
FIG. 5 shows different signal and cycle courses for illustrating a process for the modulation and demodulation of a signal voltage.

FIG. 5 shows exemplary cycle diagrams for different signals in such a circuit arrangement. The first line shows external cycle T that is modulated by higher-order apparatus C on signal voltage v. The second line shows the external data csd, that is modulated by higher-order apparatus C on signal voltage v. The third line shows the signal voltage v with the external data csd and the external cycle T, that are modulated on.

The modulation is performed in such a manner that with each second cycle slope of cycle T, i.e., with each cycle period either the first voltage level or the low-voltage state Vl is controlled or dropped below for one half a cycle or the third voltage level or the high voltage state Vh is controlled or exceeded for one half a cycle. Such sections controlling and/or exceeding or dropping below the corresponding voltage levels are associated by a combinatory logic in circuit arrangement J with signal voltage v corresponding to the high or low signal course of the signal for the external data csd sent from higher-order apparatus C. Shown for illustration in FIG. 5.

After the transmission into comparator circuit K the signal ki of the fourth line can be tapped off on the output of the second comparator K2, which signal then always has a high cycle if a high data state of external data csd is present. The fifth line shows the signal course and/or the output signal ko on the output of the first comparator K1. Then, if the external data csd is in the low state, this comparator output signal of the first comparator K1 is accordingly in the low state. The internal cycle jclk shown in the sixth line and the internal data jd shown in the seventh line are reconstructed from these output signals ki, ko of the two comparators K1, K2 and made available for further circuit components of circuit arrangement J.

The signal sequence for the activation of an operating mode, especially the test operating mode, can therefore be taken according to an embodiment additionally or alternatively to a remainder or a voltage interruption from the voltage values of signal voltage v applied on the two connection contacts S0, SDAT. In the case of a first startup the test operating mode is automatically activated by the register values that are all set to 0.

Furthermore, a sending procedure of circuit arrangement J to higher-order apparatus C is shown sketched in the seventh line. For example, data o of circuit arrangement J is outputted from circuit arrangement J via connection contact SDAT, on which signal voltage v is applied.

A data transfer in particular with the following procedure is made possible with these components and the corresponding components in higher-order apparatus C.

In order to send a logical one from circuit arrangement J, that is, the side receiving cycle T to the side sending cycle T, the higher-order apparatus C sending cycle T applies a high voltage state Vh with the initiating rising slope f1 as signal voltage v at first at the end of the third bit bit3 and/or at the beginning of the fourth bit bito. Circuit arrangement J leaves this voltage state v unchanged.

In order to send a logical zero by circuit arrangement J, higher-order apparatus C transmitting cycle T again applies a high voltage state Vh over the time of a bit period. However, in order to transmit the logical zero circuit arrangement J pulls down signal voltage v, preferably strongly down at first and then more weakly. At the end of that time, that is, one half a cycle time of cycle T, higher-order apparatus C pulls signal voltage v strongly onto the middle voltage state Vm.

Accordingly, a preferred time course for the transmission of data to be sent is split into several phases with appropriate drivers being cut in and out according to which logical value the signal to be outputted or the data value of data jo to be outputted has. This is sketched by way of example using FIGS. 6 and 7 for the two logical states 1 and 0.

Figure 6:
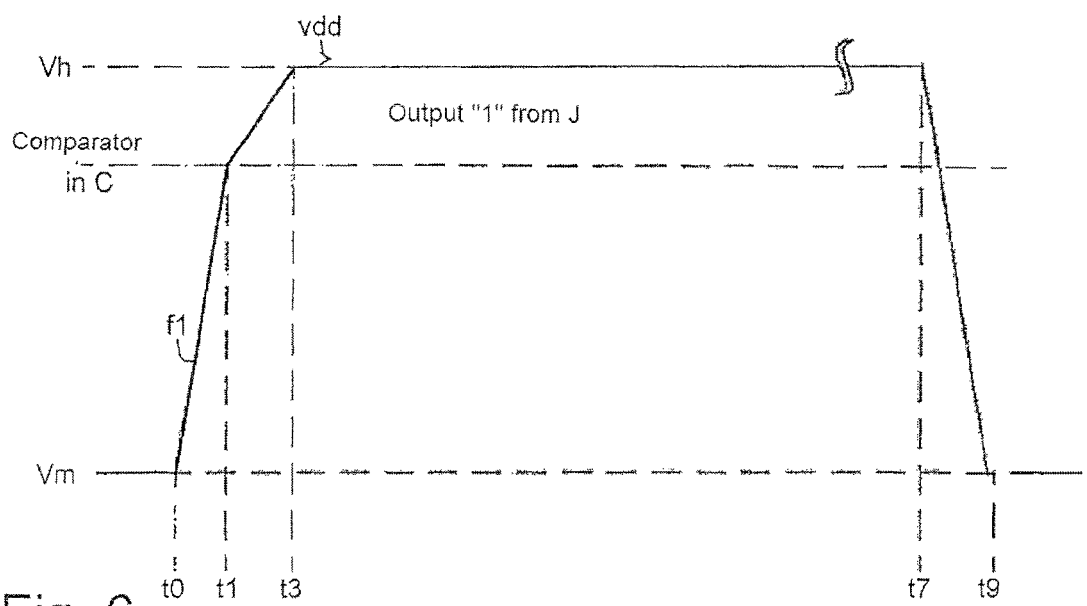
FIG. 6 shows an exemplary voltage course upon the reception of a bit by the integrated circuit arrangement.

FIG. 6 shows the instance by way of example in which during the fourth cycle or bit bito the logical value 1 is to be sent as data jo to be sent from circuit arrangement J to higher-order apparatus C. The course of signal voltage v over time t is shown. At the beginning t0 a start is made accordingly from the middle voltage state Vm with rising slope f1. To this end the strong as well as the weak pull-up driver CPUS, CPUW of higher-order apparatus C are cut in. At a later time t1 during the rising first slope f1 the strong pull-up driver CPUS is cut out upon reaching a given voltage. At a still later time t3 the high voltage state Vh is reached, at which only the weak pull-up driver CPUW of higher-order apparatus C is still actively connected. In this voltage state signal voltage v remains up to a time t7 shortly before expiration of one half of the clock cycle of cycle T. At this time t7 weak pull-up driver CPUW is cut out and a strong middle driver in higher-order apparatus C is cut in in order to pull signal voltage v onto the middle voltage state Vm. The latter is achieved at an even later time t9. At the same time even the transmission of logical value 1 from circuit arrangement J to higher-order apparatus C is also terminated.

Figure 7:
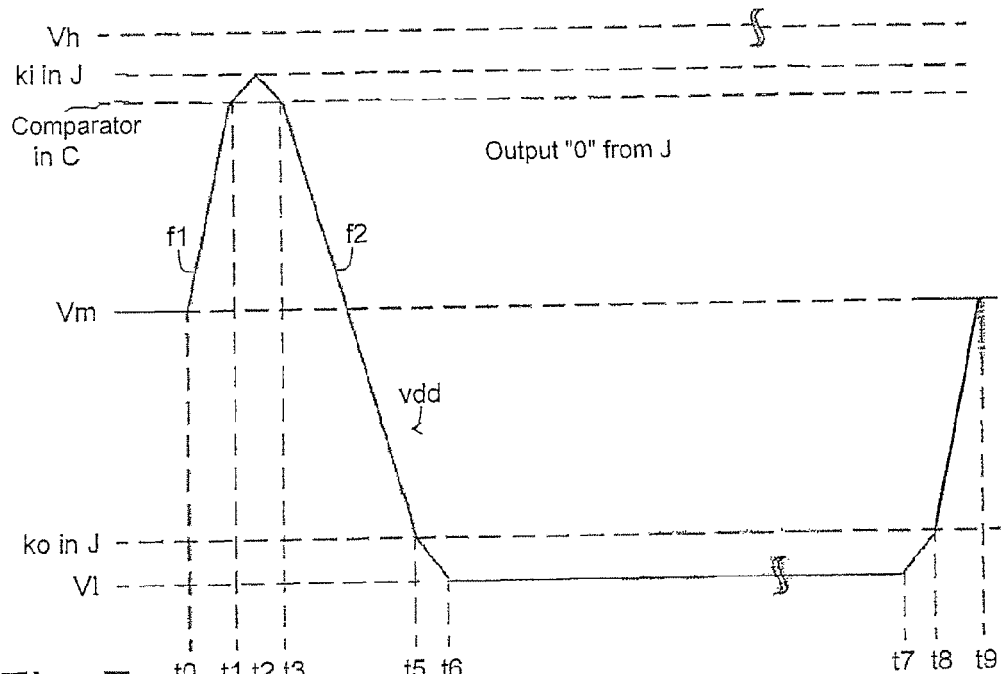
FIG. 7 shows an exemplary voltage course for a sending state of the circuit arrangement.

FIG. 7 shows a corresponding diagram for the transmission of logical value 0 from circuit arrangement J to higher-order apparatus C. The first courses are essentially the same here as in the course of the first three times t0, t1, t3 according to FIG. 6. However, the second comparator K2 in circuit arrangement J detects the rising slope f1 and signalizes this by an appropriate internal clock signal jclk and data signal jd to control apparatus JD. The latter is located at this time in a state in which the strong and the weak pull-down drivers are activated, so that the two transistors Tw, Ts are activated. This brings about a pulling down of signal voltage v. This is detected at a following time t3 by an appropriate comparator in higher-order apparatus C, upon which higher-order apparatus C cuts out its weak pull-up driver CPUS at an appropriate comparator signal equal to 0. The voltage state for the chronological point t3 of signal voltage v corresponds to this. Consequently, signal voltage v drops in the direction of the low voltage state Vl, which can be recognized by the second slope f2. Shortly before the low voltage state Vl is reached an appropriate comparison signal is outputted as output signal ko by the first comparator K1 of circuit arrangement J, whereupon its control apparatus JC cuts out the strong pull-down driver JPDS. Signal voltage v is pulled down further to deep voltage state Vl by weak pull-down driver JPDW, which is sketched for a subsequent time t6. Signal voltage v remains in this voltage state Vl until a time t7 shortly before the expiration of one half of the period of cycle T. At the seventh time t7 the strong middle driver is cut in so that signal voltage v rises again to the middle voltage state Vm. Shortly after the beginning of the rise this is detected by first comparator K1. Based on an appropriate comparison signal of first comparator K1 that signalizes an exceeding of a corresponding lower threshold value, weak pull-down driver JPDW is cut out at a time t8 that shortly follows. Signal voltage v has again reached the middle voltage state Vm at the sketched, subsequent time t9, and the transmission of a logical zero from state of the art J to higher-order apparatus C is terminated.

Figure 8:
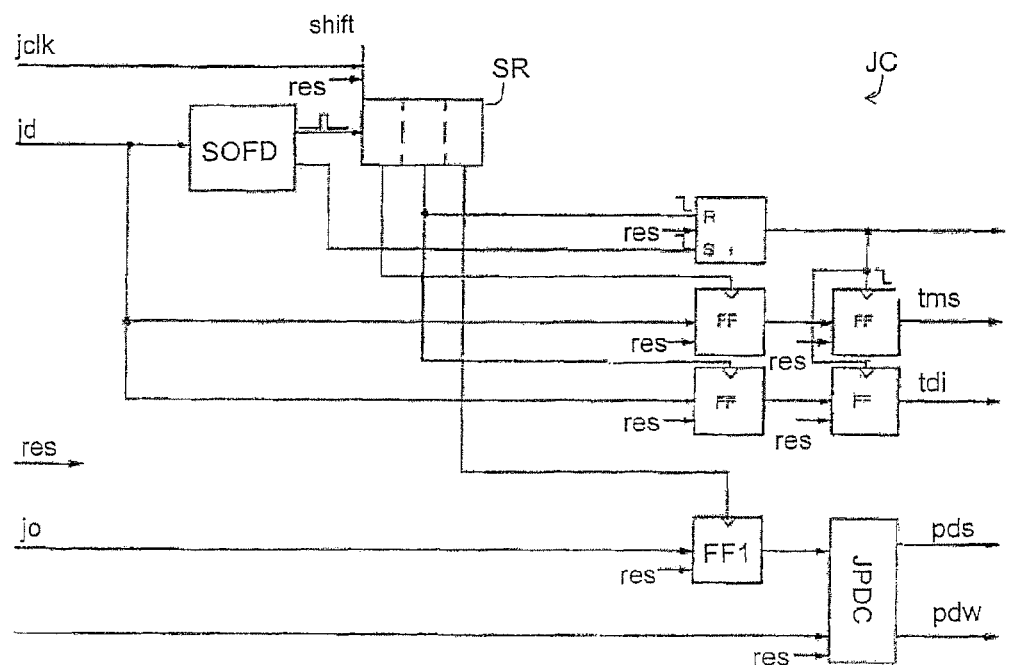
FIG. 8 shows components of an exemplary circuit diagram of the control apparatus for making available control signals for a switching apparatus for sending data from the circuit arrangement to the higher-order apparatus.

FIG. 8 shows components of a preferred control apparatus JC of the integrated circuit arrangement by way of example. The internal cycle jclk gained from the transmission and the received data jd are applied on the sketched components. The received data is applied on a module for the detection of a sending start SOFD. Upon the detection of the received value the latter is applied on a shift register SR. Shift register SR shifts the applied values one position further with each cycle jclk. A third register site of shift register SR is applied on a cycle input of a flip-flop FF1 on which the state or logical value 0 or 1 of data jo to be outputted is applied. An initial value of flip-flop FF1 is applied on pull-down control JPDC, on which, furthermore, the initial value or the output signal ko of the first comparator K1 is applied. Further components serve to output a cycle signal TCK and values dbit0, dbit1 of the second and third bit bit2, bit3, that is, to output the received and reconstructed data jd. The components can be reset by a resetting signal res.

According to an alternative embodiment, even three or more connection contacts can be provided on the circuit arrangement. In particular, even a different voltage than the signal voltage v cited here by way of example can be used for the bidirectional transmission of data as is described here.

Also, a voltage with a communication line that is dominant at a low voltage level does not have to be obligatorily used. Even an arrangement with inverse voltage states is conceivable.

Such a process can be advantageously used not only in the framework of the testing of integrated circuit arrangements by only two voltage connections but also in the framework of the further applications. In addition to the serial transmission of data, designs as a so-called debug interface are offered in the development of an application. Even a programming interface (flash—EEPROM) or the test interface for production tests can be realized.

In the claims, means or step-plus-function clauses are intended to cover the structures, systems, or operations described or suggested herein as performing the recited function and not only structural equivalents, systems, or operations but also equivalent structures, systems, and operations. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

What is claimed is:

1. An integrated circuit arrangement comprising:
    (a) a plurality of connection contacts for a serial exchange of at least one of data or signals with external components and apparatuses; and
    (b) a control apparatus for a cycle-clocked receiving of at least one of data or signals by means of a signal voltage on at least one of said plurality of connection contacts, said voltage being modulated among at least a low, a middle, and a high voltage states;
    wherein said control apparatus further comprises a switching apparatus, which is designed and/or controlled in such a manner that said data is sent in a sending mode via said connection contacts and wherein said switching apparatus, after having received a slope changing from one of said voltage states into another one of said voltage states, pulls said another one of said voltage states before a chronological expiration of half a clock cycle of said cycle into one of said voltage states that is different from a viewpoint of said another one of said voltage states.

2. The circuit arrangement according to claim 1, wherein said control apparatus is a serial interface circuit.

3. The circuit arrangement according to claim 1, in which said control apparatus is at least one of designed or controlled in such a manner that said data is sent in said sending mode via said connection contact in that said switching apparatus, after having received a slope changing from said middle voltage state into a choice of either said high voltage state or said low voltage state, pulls said chosen voltage state before the chronological expiration of half a clock cycle of the cycle into said chosen low or high voltage state.

4. The circuit arrangement according to claim 3, comprising a comparator circuit that is at least one of designed or controlled to extract first data modulated onto said signal voltage as well as second data internal to said circuit arrangement as well as a cycle modulated onto said signal voltage and internal to said circuit arrangement.

5. The circuit arrangement according to claim 1, further comprising a sending control on the circuit-arrangement side that comprises:
    (a) a counter for counting a number of cycles; and
    (b) a set of data sent from said apparatus or said voltage states and comprising components for sending said set of data to said apparatus when a counting value of said counter that is fixed, or can be set as fixed, has been reached.

6. The circuit arrangement according to claim 1, with a first transistor arrangement for a weak pulling of said signal voltage into a second voltage states; and, with a second transistor arrangement for a strong pulling of said signal voltage into a third voltage states.

7. The circuit arrangement according to claim 1, which is at least one of designed or controlled for a test operating mode for applying said cycle applied with said signal voltage as said internal cycle on said components of said circuit arrangement.

8. The circuit arrangement according to claim 1, with a switching apparatus for activating a comparator circuit, said comparator circuit for analyzing one or more of:
    (a) said signal voltage;
    (b) a test interface in a test operating mode;
    (c) a development of said circuit arrangement;
    (d) a development of a software application of said circuit arrangement;
    (e) a band end programming; and
    (f) an error search in a second application realized by said circuit arrangement.

9. The circuit arrangement according to claim 1, that is at least one of designed or controlled for outputting data, made available by said circuit arrangement as said data to be sent in the sending mode via said connection contact.

10. The circuit arrangement according to claim 9, wherein said data comprises one from a group comprising: measuring data and sensor data.

11. An apparatus comprising:
    (a) a set of connection contacts for serial data and/or signal exchange with an integrated circuit arrangement; and
    (b) a control apparatus for sending data clocked by a cycle by the modulation of a signal voltage among at least a low, a middle and a high voltage state on such a connection contact;
    wherein said interface is at least one of designed or controlled in such a manner that it changes in a receiving mode from one of the voltage states into another one of the voltage states and it detects a reception of data from the circuit arrangement at least upon a pulling of said another voltage state prior to a chronological expiration of one half a clock cycle of the cycle into one of the voltage states that is different from the point of view of said another voltage state by the circuit arrangement.

12. The apparatus of claim 11, wherein said circuit arrangement further comprises:
    (a) a plurality of connection contacts for the serial exchange of at least one of data or signals with external components and apparatuses; and
    (b) said control apparatus for the cycle-clocked receiving of said data and/or said signals by means of a signal voltage on said connection contact, said voltage being modulated between at least a low, a middle, and a high voltage states;

wherein said control apparatus further comprises a switching apparatus, which is at least one of designed or controlled in such a manner that said data is sent in a sending mode via said connection contact in that said switching apparatus, after having received a slope changing from one of said voltage states into another one of said voltage states, pulls said another one of said voltage states before the chronological expiration of half a clock cycle of said cycle into one of said voltage states that is different from a viewpoint of said another one of said voltage states.

13. The apparatus according to claim 11, in which said control apparatus is at least one of designed or controlled in such a manner that it changes in a receiving mode from said middle voltage state into a choice of a high or low voltage state and detects a reception of data from said circuit arrangement by said circuit arrangement at least upon a pulling of said voltage state prior to the chronological expiration of one half a clock cycle of said cycle into said chosen low or said chosen high voltage state.

14. The apparatus according to claim 13, in which said interface is at least one of designed or controlled for the recessive application of said signal voltage during a change into said chosen voltage state.

15. A system for the transmission of data or signals via a common connection contact with an integrated circuit arrangement of an apparatus; said system comprising:
(a) said integrated circuit arrangement including:
  (i) a plurality of connection contacts for the serial exchange of at least one of data or signals with external components; and
  (ii) a first control apparatus for the cycle-clocked receiving of said data and/or said signals by means of a signal voltage on said connection contact, said voltage being modulated among at least a low, a middle, and a high voltage states;
(b) said apparatus including:
  (i) a set of connection contacts for at least one of serial data or signal exchange with an integrated circuit arrangement; and
  (ii) a second control apparatus for sending data clocked by a cycle by the modulation of a signal voltage between at least a low, a middle and a high voltage states on such a connection contact; and
(c) wherein said interface is at least one of designed or controlled in such a manner that it changes in a receiving mode from one of the voltage states into another one of the voltage states and it detects a reception of data from the circuit arrangement at least upon a pulling of said another voltage state prior to a chronological expiration of one half a clock cycle of the cycle into one of the voltage states that is different from the point of view of said another voltage state by the circuit arrangement.

16. A process for the serial transmission of data by modulation of a signal voltage on a connection contact of an integrated circuit arrangement, comprising step of:
(a) receiving a slope changing signal voltage varying among at least a low, a middle and a high voltage states at the connection contact;
(b) pulling said signal voltage, by an apparatus connected to said connection contact, into another one of said voltage state by said integrated circuit arrangement for serial sending of said data after reception of said slope, wherein said slop is applied on the connection contact by said apparatus and by said circuit arrangement, and wherein:
  (i) said signal voltage is pulled into said low or said high voltage state for sending a first data state after reception of said slope;
  (ii) said signal voltage is left in said voltage state applied by said apparatus for sending a second data state after reception of said slope;
  (iii) said signal voltage is changed by said apparatus by a cycle in a clocked manner, and in which said signal voltage is pulled, after reception of said slope prior to a chronological expiration of one half a clock cycle of said cycle, by the integrated circuit arrangement into said low or said high voltage state; and
(c) including a protocol wherein a fixed number of successively following times or cycles may be sent by said apparatus and thereafter or, alternating therewith, a fixed number of successively following times or at least one cycle, may be sent by said circuit arrangement.

17. The process according to claim 16, in which said apparatus changes said signal voltage in a clocked manner within a clock cycle for transmitting a cycle to said circuit arrangement by a change of said voltage state of said signal voltage between two of the riddle voltage state, of the higher voltage state, or of the lower voltage state, and by changing said voltage state back.

18. The process according to claim 16, in which said signal voltage is changed by said apparatus by a cycle in a clocked manner, and in which said signal voltage is pulled, after reception of said slope prior to a chronological expiration of one half a clock cycle of said cycle, by the integrated circuit arrangement into said lower or higher voltage state.

* * * * *